US011791011B1

(12) United States Patent
Tamano et al.

(10) Patent No.: US 11,791,011 B1
(45) Date of Patent: Oct. 17, 2023

(54) SELF-REPAIR VERIFICATION

(71) Applicant: Micron Technology, Inc., Boise, ID (US)

(72) Inventors: Takuya Tamano, Boise, ID (US); Yoshinori Fujiwara, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/735,528

(22) Filed: May 3, 2022

(51) Int. Cl.
*G11C 29/44* (2006.01)
*G11C 29/12* (2006.01)

(52) U.S. Cl.
CPC .......... *G11C 29/4401* (2013.01); *G11C 29/12* (2013.01)

(58) Field of Classification Search
CPC ...................... G11C 29/4401; G11C 29/12
See application file for complete search history.

(56) References Cited

U.S. PATENT DOCUMENTS

| 9,626,244 B2* | 4/2017 | Sohn ...................... G11C 29/44 |
| 2002/0122341 A1* | 9/2002 | Perner ................... G11C 29/78 365/200 |
| 2015/0043288 A1* | 2/2015 | Kim ...................... G11C 11/4087 365/189.05 |
| 2020/0058365 A1* | 2/2020 | Kim ...................... G06F 11/1048 |
| 2021/0055985 A1* | 2/2021 | Lee ......................... G11C 29/76 |
| 2021/0158886 A1* | 5/2021 | Kim ........................ G11C 29/785 |

OTHER PUBLICATIONS

S.-K. Lu, H.-H. Huang, J.-L. Huang and P. Ning, "Synergistic Reliability and Yield Enhancement Techniques for Embedded SRAMs," in IEEE Transactions on Computer-Aided Design of Integrated Circuits and Systems, vol. 32, No. 1, pp. 165-169, Jan. 2013, doi: 10.1109/TCAD.2012.2210420. (Year: 2013).*

* cited by examiner

*Primary Examiner* — Daniel F. McMahon
(74) *Attorney, Agent, or Firm* — Holland & Hart LLP

(57) ABSTRACT

Methods, systems, and devices for self-repair verification are described. A memory system may receive, at a memory device, a command to initiate a repair operation. The memory system may perform the repair operation by replacing a first row of memory cells of the memory device with a second row of memory cells of the memory device. The memory system may write first data to the second row of memory cells, and read second data from the second row of memory cells, based on a stored indication associated with the replacement of rows. The memory device may output an error flag with a first value based at least in part on reading the second data, and the first value of the error flag may indicate that the repair operation was successfully performed based at least in part on the second data matching the first data.

25 Claims, 6 Drawing Sheets

SELF-REPAIR VERIFICATION

FIELD OF TECHNOLOGY

The following relates to one or more systems for memory, including self-repair verification.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
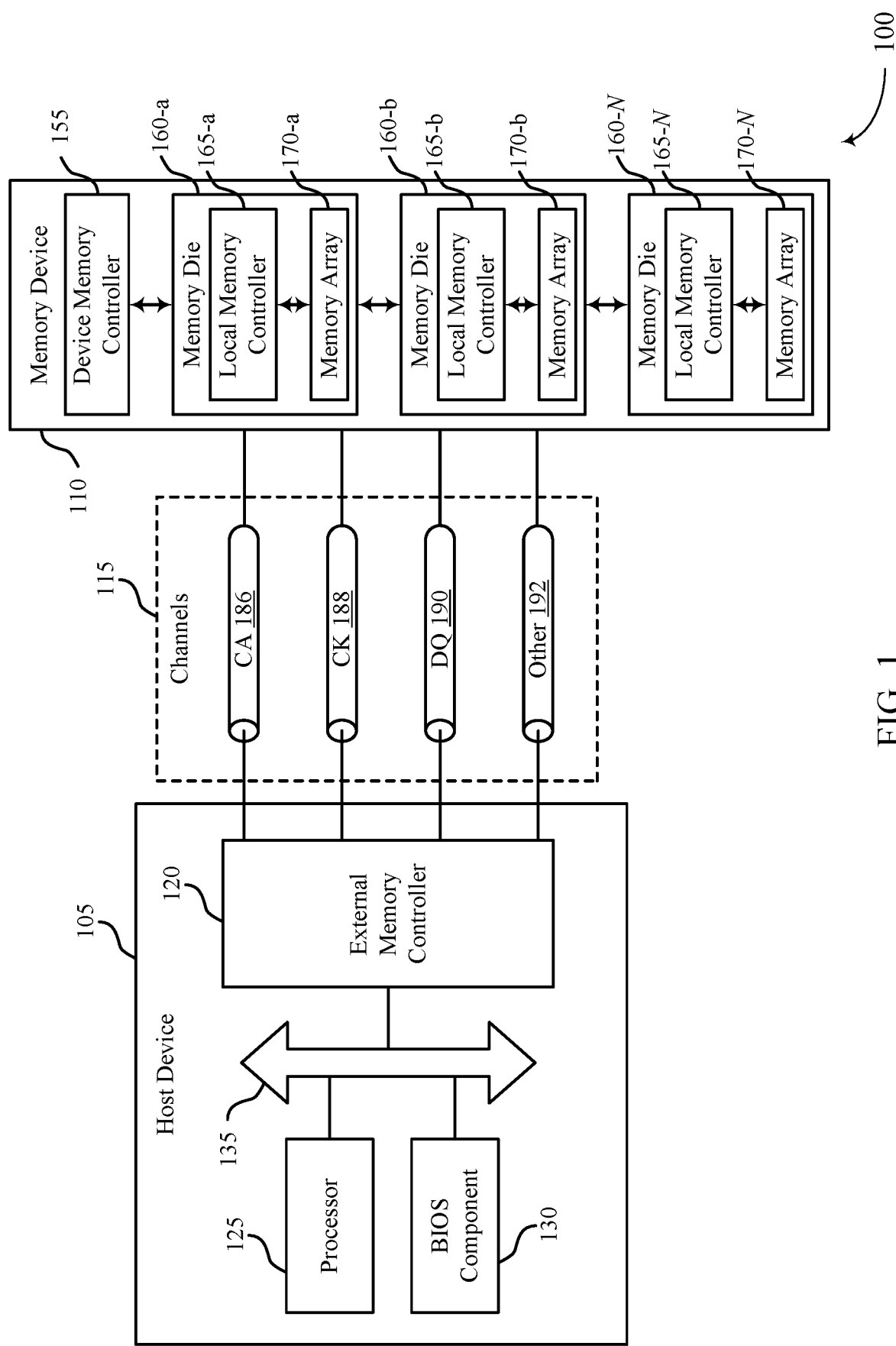
FIG. 1 illustrates an example of a system that supports self-repair verification in accordance with examples as disclosed herein.

Some memory systems may include self-test circuitry, such as memory built-in self-test (mBist) circuitry, that may enable the memory device to perform self-test procedures to identify or repair defects in a memory device. Such self-test circuitry may include, for example, a pattern generator that is configured to generate test values and memory addressing sequences for testing the memory array. The self-test circuitry may be configured to step through a sequence of instructions for writing test values to a memory array, reading the values back from the memory array, and determining whether the memory array is faulty (e.g., whether it includes one or more errors) based on whether the values read from the memory array correspond to the values written to the memory array.

In some cases, a memory system may implement an mBist-Post Package Repair (mPPR) sequence. The mPPR sequence may repair a failed row address of the memory system in conjunction with the mBist circuit to automatically repair failing addresses based on the results of mBist. For example, an mPPR sequence may replace a failed row address with a redundant row address, such that the failed row address is disabled and the redundant row address is activated. However, such systems may not be able to test whether the mPPR sequence successfully repaired a failed row. Because various errors may occur in repairing a failed row, it may be desirable to test whether a mPPR sequence was successfully performed.

A system configured to test whether a mPPR sequence is successfully performed is described herein. For example, the system may support a self-repair verification sequence for identifying unintended or incomplete repairs performed by the mPPR before access operations (e.g., read or write operations) on the memory array resume. In such examples, a test sequence on the repaired row may indicate a repair error (e.g., via a value of an error flag). Alternatively, when a successful repair is identified, the self-repair verification may indicate that the memory system is functioning without error (e.g., via a different value of the error flag).

As described herein, a memory system may include a verification circuit that may be configured to perform a self-repair verification within an mPPR sequence. That is, the verification circuit may perform, in combination with a repair operation, a series of one or more access operations on a failed or repaired memory row. For example, the memory system may perform a repair operation on a failed memory row of a memory array. The repair operation may replace the failed memory row address with a redundant memory row address, such that operations concerning the failed memory row will be directed to the redundant row.

A self-repair verification sequence may occur after the repair operation, in which the memory system may write data to the redundant row. The memory system may attempt to read the data from the stored failed memory row address. In some cases, when the repair operation has been completed, the read operation may activate the one or more redundant rows and the data may be read. Alternatively, if the repair operation failed, an incorrect row of memory cells may be activated, thus resulting in incorrect data being read from the memory array. For example, incorrect data may be read from the failed memory row (or from another row), or no data may be read. Based on the data read from the array (e.g., the expected data, incorrect data, no data, or the like), the verification sequence may indicate a successful or unsuccessful repair operation using an output error flag. Such an approach may provide a direct verification process without unduly increasing error processing overhead.

Features of the disclosure are initially described in the context of systems and dies as described with reference to FIGS. 1 and 2. Features of the disclosure are described in the context systems and a process flow diagram as described with reference to FIGS. 3 and 4. These and other features of the disclosure are further illustrated by and described with reference to an apparatus diagram and flowcharts that relate to self-repair verification as described with reference to FIGS. 5 and 6.

FIG. 1 illustrates an example of a system 100 that supports self-repair verification in accordance with examples as disclosed herein. Although FIG. 1 is described with reference to a DRAM system, in some examples, one or more embodiments of the system 100, or its functions described herein, may be implemented by or applicable to any memory system that uses repair operations. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. In some cases, a memory array 170 may be a grid of memory cells organized into columns and rows. One or more rows of memory cells may be physically redundant memory cells. For example, a memory array 170 may include a first row of memory cells and a second row of memory cells, and the second row may be a physical copy of the first row with a different memory cell address. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. In some cases, the device memory controller 155 may control operation of a row decoder in order to perform various operations at a memory array 170. For example, the memory device controller 155 may enable the memory device 110 to perform one or more read or write operations.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, data channels 190 may be operable to communicate information (e.g., data, control information) between the host device 105 and the memory device 110. For example, the data channels 190 may communicate information (e.g., bi-directional) to be written to the memory device 110 or information read from the memory device 110. In some cases, the data channels 190 may communicate access operations, repair operations, verification operations, operation results, or some combination thereof, between the host device 105 and the memory device 110.

In some examples, the device memory controller 155 may communicate with one or more circuits to perform other operations (e.g., repair operations, testing operations, or the like). For example, the device memory controller may operate or otherwise communicate with a repair circuit (e.g., a mBist circuit) to perform a repair sequence (e.g., an mPPR sequence) on one or more memory rows of a memory array 170. Additionally, the device memory controller 155 may operate or otherwise communicate with a verification circuit to perform a verification of the repair sequence. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, a host device 105 may output, to the memory device 110, a command to initiate a repair operation on one or more failed memory rows of a memory array 170. The device memory controller 155 may initiate the repair operation, via a repair circuit, and consequently a verification operation, on the failed memory rows. For example, the device memory controller 155 may control operation of a row decoder in order to replace the failed memory row with a physically redundant memory row (e.g., replace the failed memory row address with a redundant memory row address) of a memory array 170. In some cases, the memory device 110 may output a result to the host device 105. For example, the memory device may indicate (e.g., via an error flag) that the repair operation was successful, or alternatively, that the repair operation failed. In some cases, the memory device 110 may output a separate indication to the host device 105 that the repair operation, including the verification operation, has ended. In some cases, the repair operation may use a repair circuit and the verification operation may use a verification circuit. As described herein, such operations may provide a direct verification process without unduly increasing error processing overhead of the memory device 110.

Figure 2:
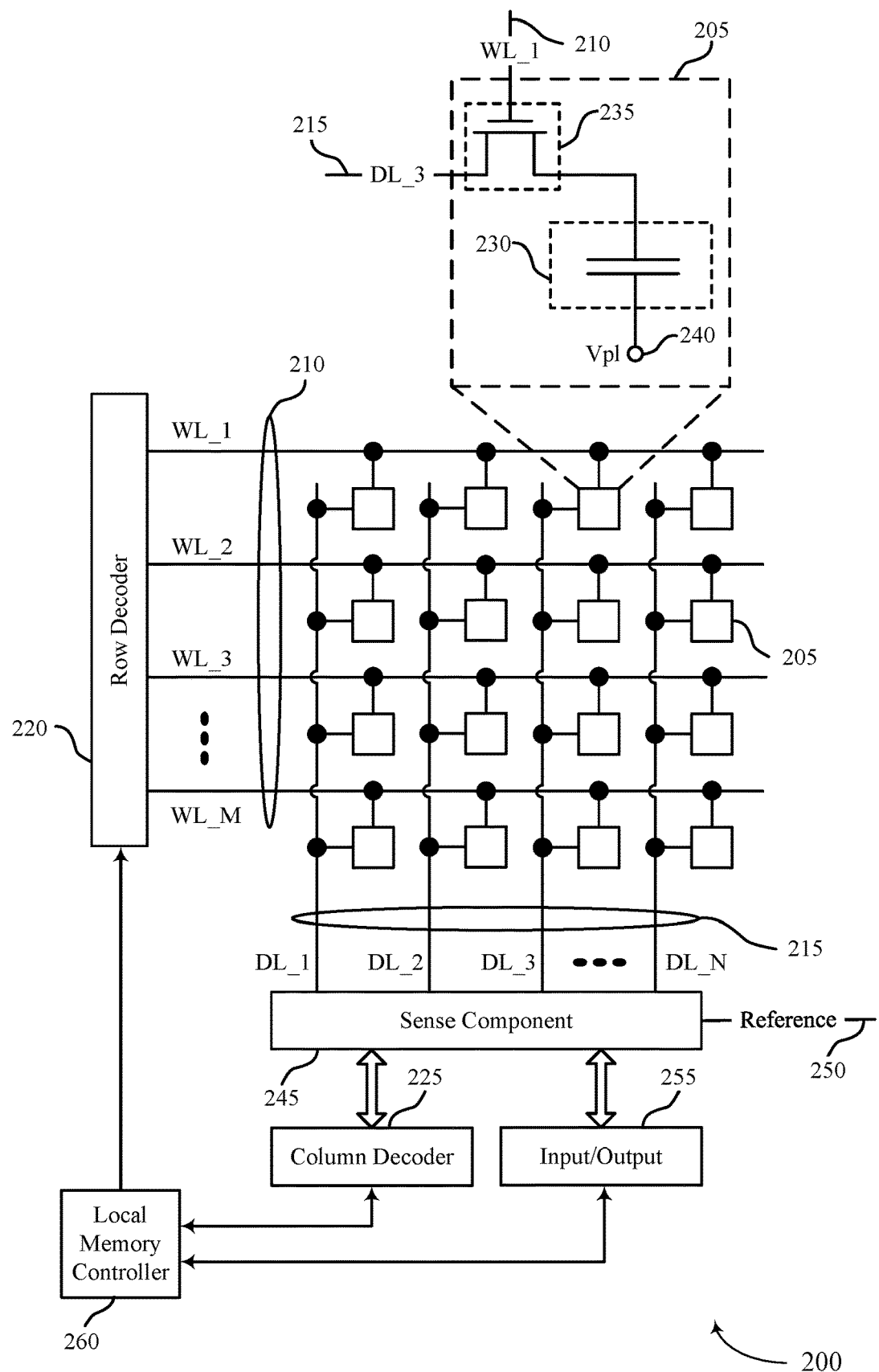
FIG. 2 illustrates an example of a memory die that supports self-repair verification in accordance with examples as disclosed herein.

FIG. 2 illustrates an example of a memory die 200 that supports self-repair verification in accordance with examples as disclosed herein. Although FIG. 2 is described with reference to a DRAM system, in some examples, one or more embodiments of the memory die 200, or its functions described herein, may be implemented by or applicable to any memory system that uses repair operations.

The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss. In some cases, a memory cell 205 may fail due to charge leakage, parasitic capacitance, or the like.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address. In some cases, a row decoder 220 may be operable to replace or redirect a first row address with a second row address. For example, the row decoder may replace the memory row address of a failed memory row with the memory row address of a redundant memory row. In such examples, when a host device attempts to access the failed memory row, it may instead access a functioning physical copy of the desired memory row.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

In some examples, the local memory controller 260 may communicate with one or more circuits to perform other operations (e.g., repair operations, testing operations, or the like). For example, the local memory controller 260 may operate or otherwise communicate with a repair circuit (e.g., a mBist circuit) to perform a repair sequence (e.g., an mPPR sequence) on one or more memory rows of a memory array. Additionally, the local memory controller 260 may operate or otherwise communicate with a verification circuit to perform a verification of the repair sequence.

In some examples, a host device may output, to the memory die 200, a command to initiate a repair operation on one or more failed memory rows of a memory array. The local memory controller 260 may initiate the repair operation, via a repair circuit, and consequently a verification operation, on the failed memory rows. For example, the local memory controller 260 may control operation of a row decoder in order to replace the failed memory row with a physically redundant memory row (e.g., replace the failed memory row address with a redundant memory row address) of a memory array. In some cases, the local memory controller 260 may output a result to the host device. For example, the memory device may indicate (e.g., via an error flag) that the repair operation was successful, or alternatively, that the repair operation failed. In some cases, the local memory controller 260 may output a separate indication to the host device that the repair operation, including the verification operation, has ended. In some cases, the repair operation may use a repair circuit and the verification operation may use a verification circuit. As described herein, such operations may provide a direct verification process without unduly increasing error processing overhead of the memory die 200.

Figure 3:
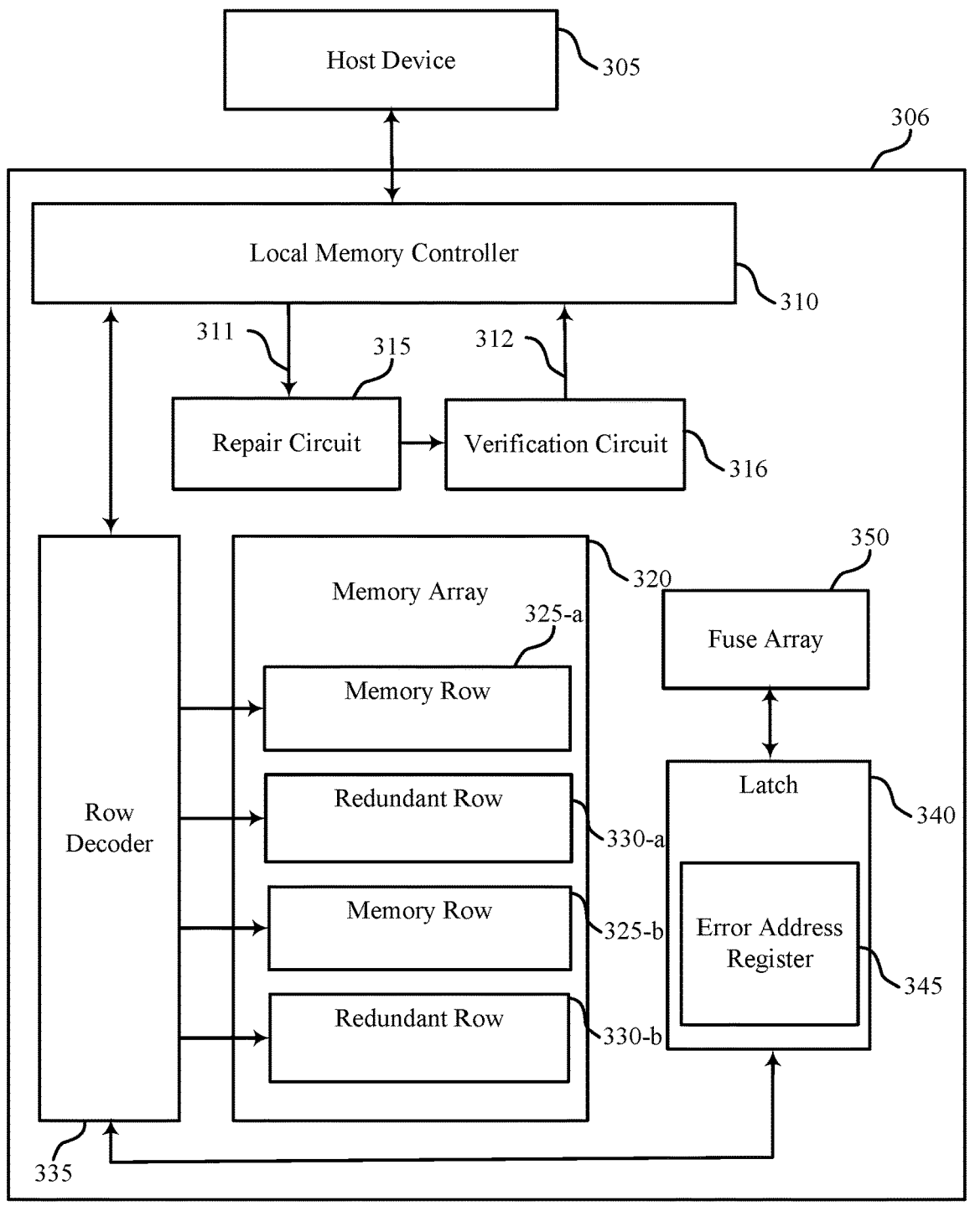
FIG. 3 illustrates an examples of a system that supports self-repair verification in accordance with examples as disclosed herein.

FIG. 3 illustrates an example of a system 300 that supports self-repair verification in accordance with examples as disclosed herein. The system 300 may be an example of a system 100 or memory die 200 as described with reference to FIG. 1, FIG. 2, or aspects thereof. Memory system 306 may include or may be coupled with a plurality of channels for communicating information with, for example, self-test circuits (e.g., repair circuit 315, verification circuit 316), with a host device 305, or with another device. The memory system 306 may include a local memory controller 310, a repair circuit 315, a verification circuit 316, a row decoder 335, a memory array 320 coupled with the row decoder 335, a latch 340, and a fuse array 350. The memory array 320 may include one or more memory rows (e.g., 325-*a* and 325-*b*) and one or more redundant memory rows (e.g., 330-*a* and 330-*b*). In some examples, a redundant memory row 330 of the one or more redundant memory rows may replace a memory row 325. For example, if memory row 325-*a* failed, a redundant memory row 330-*a*, 330-*b*, or some other redundant memory row may replace the memory row 325-*a*. The fuse array 350 may include a set of one or more fuses, each fuse associated with a respective memory cell of memory array 320.

The memory system 306 may be configured to store data received from the host device 305 and to communicate (e.g., transmit) data to the host device 305. For example, the host device 305 may communicate an access command to the local memory controller 310 of the memory system 306. The local memory controller 310 may enable the row decoder to access (e.g., read or write) a memory row 325 indicated by the access command.

In some cases, the host device may send a repair operation command to the memory system 306. For example, the memory system may detect an error in performance, or perform a routine testing operation, and the host device 305 may send the repair operation command to initiate a repair operation of the memory array 320. Based on the repair operation command, the memory system 306 may begin a repair operation (e.g., mBist sequence) using a repair circuit 315 (e.g., mBist circuit). For example, the memory system 306 may perform a background write operation to the entire memory system 306 and may perform a read operation on the one or more memory rows 325 of the memory array 320. The read operation may identify one or more failed memory rows (e.g., memory row 325-*a*, memory row 325-*b*, or the like). For example, one or more memory cells of the memory row 325 may fail to store the desired data due to leakage, a short between two or more cells, or due to other faults. The memory system 306 may capture the memory row address of the failed memory row 325 and store it at an error address register 345 located within a latch 340 (e.g., mBistErrLatch).

The memory system 306 may perform an mPPR repair sequence using the repair circuit 315 (e.g., the mBist circuit 315) and the row decoder 335. In some cases, the memory system 306 may use the failed memory row address stored in the error address register 345 to locate the failed memory row address. The memory system 306 may replace the failed memory row address with another memory row address (e.g., of a physically redundant memory row 330). In such examples, a successful replacement may redirect access commands for the failed memory row (e.g., memory row 325-a) to the redundant memory row (e.g., redundant row 330-a). In some cases, the repair operation may include writing an indication of the failed memory row address to a set of fuses of fuse array 350, such as a set of fuses associated with the redundant memory row 330. In some cases, the memory system 306 may output, to the host device 305, to the local memory controller 310, or to some other controller, an indication that the mPPR repair sequence is complete (e.g., by outputting a PPR_End signal=1).

After the mBist sequence has is completed, the memory system 306 may perform a verification sequence using a verification circuit 316. For example, the memory device may perform an mPPR post-verification sequence in order to verify whether the mPPR repair sequence was successfully (or unsuccessfully) performed. In some cases, the mPPR verification sequence may be triggered by the indication that the mPPR repair sequence is complete. Alternatively, the mPPR verification sequence may be triggered by a verification command, such as a command received directly from the host device or from the local memory controller 310. The mPPR post-verification sequence may include reading out values from the fuse array 350 to confirm that the fuses were correctly programmed to replace the failed memory row with the redundant memory row (e.g., that the fuses associated with the redundant memory row store the address of the failed memory row).

The mPPR post verification may activate, through verification circuit 316 and the row decoder 335, the memory row associated with the failed memory row address (e.g., stored in mBistErrLatch). For example, the verification circuit 316 may activate the physically redundant row 330 instead of the failed memory row 325. The memory system 306 may write, based at least in part on receiving the command to initiate the repair operation, the expected data to the active row of memory cells. For example, the memory system 306 may write the expected data to each column space of the redundant memory row 330. If the repair operation was successful, expected data may be read from the redundant memory row 330. Alternatively, not reading the expected data from the redundant memory row 330 may indicate an unsuccessful repair operation. In some cases, based on an unsuccessful repair operation, the memory system may identify one or more fuses of the fuse array 350 storing respective values that do not match the expected values.

In some cases, the memory system 306 may perform an optional stage (e.g., a disabled redundancy row sequence) within the verification sequence, in addition to writing test data to the redundant memory rows 330 and prior to reading the redundant row 330. For example, based on the stored indication associated with replacing the failed memory row 325 with the redundant memory row 330, the memory system 306 may activate the failed memory rows 325 and deactivate the redundant memory rows 330. The memory system 306 may write an inverted copy of the expected data to the failed memory row 325. Upon writing the inverted data to the failed memory rows 325, the memory system 306 may exit the optional stage of the verification sequence. For example, the failed memory rows 325 storing the inverted data may be deactivated and the redundant rows 330 may be reactivated.

The memory system 306 may indicate a result of the verification sequence, or rather, the result of the repair operation through an output 312. If the expected data was read, the memory system 306 may output an error flag indicating that the repair operation was successful (e.g., the error flag may be set to a first vale; error flag=0). Alternatively, if the expected data was not read, the memory system 306 may output an error flag indicating that the repair operation was unsuccessful (e.g., the error flag may be set to a second value; error flat=1). For example, the error flag may be assigned a value that indicates an error associated with one or more circuits for performing the repair operation, that the repair operation was unsuccessfully performed, that one or more fuses of the memory system 306 store respective values that do not match the expected values, or a combination thereof In some cases, if the repair operation is indicated as successful, the memory system 306 may resume normal operations, such as processing access commands from the local memory controller 310. Alternatively, if the repair operation is not indicated as successful, the memory system 306 may pause operations, perform a new repair operation on the memory array 320 or on the fuse array 350, activate an alternative repair circuit 315 (e.g., via input 311), or the like. Performing a verification process as described herein may improve the overall performance and reliability of the system 300.

Figure 4:
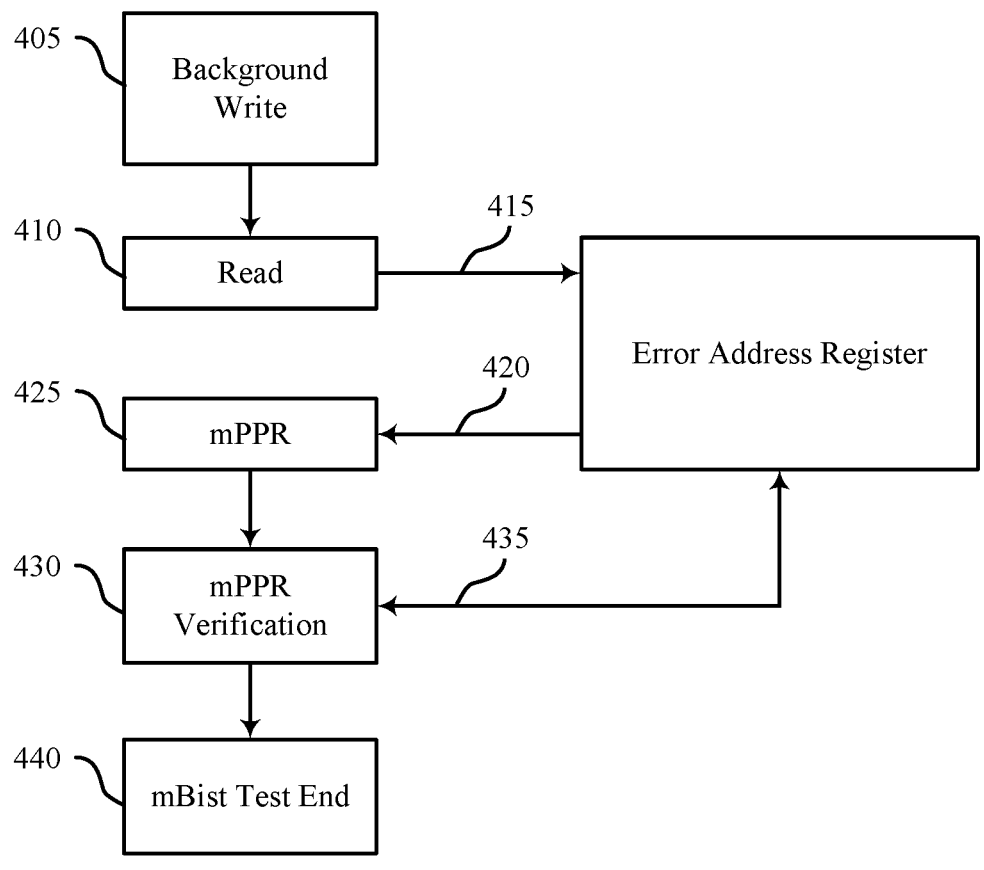
FIG. 4 illustrates an example of a process flow diagram that supports self-repair verification in accordance with examples as disclosed herein.

FIG. 4 illustrates an example of a process flow diagram 400 that supports self-repair verification in accordance with examples as disclosed herein. For example, the process flow diagram 400 may illustrate operations performed by a controller of a memory system or a memory device, or both. The controller may be an example of an external memory controller 120, a local memory controller 165, or a local memory controller 260 as described with reference to FIGS. 1 and 2. The process flow diagram 400 may depict steps in performing a repair operation in combination with a self-repair verification sequence. The process may be implemented to improve memory utilization, reduce latency, or reduce repair operation overhead, among other benefits.

Aspects of the process flow diagram 400 may be implemented by a controller, among other components. For example, the process flow diagrams may illustrate one or more steps performed by the components of the system 300 described with reference to FIG. 3. Additionally or alternatively, aspects of the process flow diagram 400 may be implemented as instructions stored in memory (e.g., firmware stored in a memory coupled with the external memory controller 120, a local memory controller 165, or a local memory controller 260). For example, the instructions, if executed by a controller may cause the controller to perform operations illustrated by the process flow diagram 400.

In the following description of the process flow diagram 400, the operations may be performed in different orders or at different times. Some operations may also be omitted from the process flow diagram 400, and other operations may be added to the process flow diagram 400. Additionally, the controller may receive multiple write commands, read commands, repair commands, verification commands, or the like, and different operations of the process flow diagram 400 may be performed based on the received commands as described herein.

At 405, a memory device may begin an mBist sequence using an mBist circuit. In some examples, the mBist sequence may begin with a memory device performing a background write operation to the entire memory device. For example, the memory device may receive, from a host device, a background write command to be performed on the memory rows of a memory array of the memory device.

At 410, the memory device may perform a read operation on the one or more memory rows of the memory array. In some cases, the read operation may identify one or more failed memory rows (e.g., the read operation may identify one or more errors occurring in one or more memory rows). For example, one or memory cells of the memory row may fail to store the desired data due to leakage, a short between two or more cells, or due to other defects.

At 415, the memory device may capture a row address of the failed memory row and store it at an error address register. In some cases, the error address register may be located within a latch (e.g., mBistErrLatch) of the memory device.

At 420, the memory device may perform a repair operation to repair the identified failed memory row. In some cases, the memory device may receive a repair command from the host device. For some repair operations, such as at 425, the memory device may perform an mPPR repair sequence using an mBist circuit or another type of repair circuit as described herein. In some cases, the memory device perform the mPPR repair using the address of the failed row stored to an error address register or a latch. The memory device may replace the failed memory row address with another memory row address (e.g., of a physically redundant memory row of the memory device). In such examples, a successful replacement may redirect access commands for the failed memory row to the redundant memory row. In some cases, the repair operation may include writing an indication of the failed memory row address to a set of fuses (e.g., one or more fuses of a fuse array) associated with the redundant memory row. In some cases, the memory device may output, to the host device, to the local memory controller, or to some other controller, an indication that the mPPR repair sequence is complete (e.g., PPR_End signal=1).

At 430, after the mBist sequence is complete (e.g., after the repair operation is complete), the memory device may perform a verification sequence. For example, the memory device may perform an mPPR post-verification sequence in order to verify the success of the mPPR repair sequence. In some cases, the mPPR verification sequence may be triggered by an indication that the mPPR repair sequence is complete. Additionally or alternatively, the mPPR verification sequence may be triggered by a verification command, such as a command received directly from the host device or from the local memory controller.

At 435, the mPPR post verification may be performed using a verification circuit or other circuitry as described herein. To perform the verification operation, the memory device may write expected data to the active row of memory cells. For example, memory device may write the expected data to all column spaces of the memory array.

In some cases, the memory device may perform an optional stage within the verification sequence (e.g., tmRedDis). For example, the memory device may activate the failed memory rows instead of redundant rows. In such cases, the memory device may write an inverted copy of expected data for all column spaces of the memory array.

The memory device may active the memory row associated with the stored failed row address in the address register or latch, and read the data at the associated memory row. If the mPPR operation was successful, the memory device may read out the expected data. Alternatively, if the mPPR operation failed, the expected data would not be read (e.g., data different than the expected data may be read), which may indicate that the repair operation was unsuccessful.

The memory device may indicate a result of the verification sequence, or rather, the result of the repair operation based on the verification operation. If the expected data was read, the memory device may output an error flag indicating that the repair operation was successful (e.g., the error flag may be set to a first vale; error flag=0). Alternatively, if the expected data was not read, the memory device may output an error flag indicating that the repair operation was unsuccessful (e.g., the error flag may be set to a second value; error flag=1). For example, the error flag may be assigned a value that indicates an error associated with one or more circuits for performing the repair operation, that the repair operation was unsuccessfully performed, that one or more fuses of the memory device store respective values that do not match the expected values, or a combination thereof. At 440, upon completing the verification sequence and outputting the error flag, the mBist verification operation may end. Performing a verification process as described herein may improve the overall performance and reliability of the associated memory system.

Figure 5:
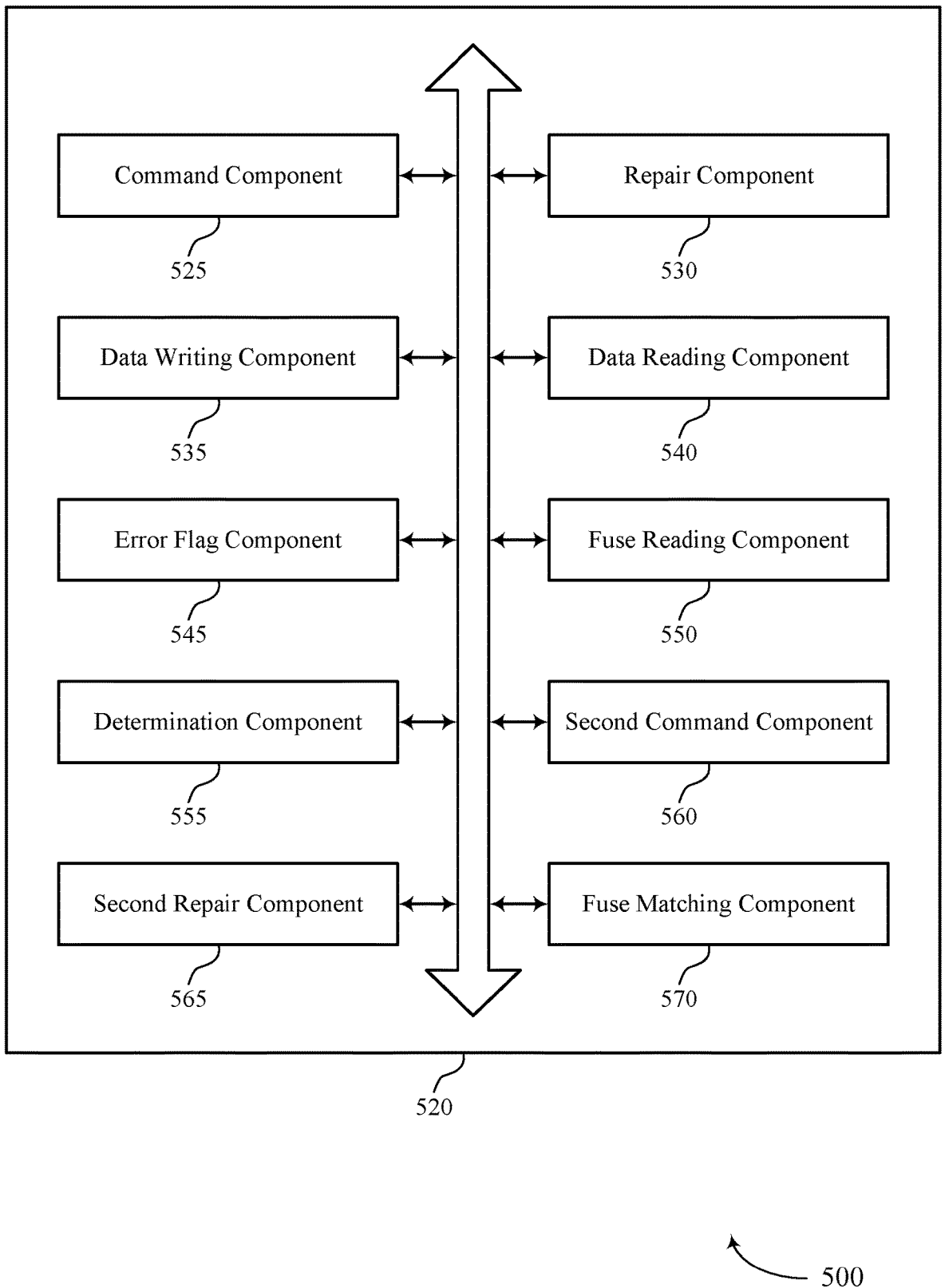
FIG. 5 shows a block diagram of a memory system that supports self-repair verification in accordance with examples as disclosed herein.

FIG. 5 shows a block diagram 500 of a memory device 520 that supports self-repair verification in accordance with examples as disclosed herein. The memory device 520 may be an example of aspects of a memory device as described with reference to FIGS. 1 through 4. The memory device 520, or various components thereof, may be an example of means for performing various aspects of self-repair verification as described herein. For example, the memory device 520 may include a command component 525, a repair component 530, a data writing component 535, a data reading component 540, an error flag component 545, a fuse reading component 550, a determination component 555, a second command component 560, a second repair component 565, a fuse matching component 570, or any combination thereof. Each of these components may communicate, directly or indirectly, with one another (e.g., via one or more buses).

The command component 525 may be configured as or otherwise support a means for receiving, at a memory device, a command to initiate a repair operation.

The repair component 530 may be configured as or otherwise support a means for performing the repair operation, where the repair operation includes replacing a first row of memory cells of the memory device with a second row of memory cells of the memory device. In some examples, prior to performing the repair operation, the first row is associated with a first row address, and the repair component 530 may be configured as or otherwise support a means for performing the repair operation on the first row of memory cells, where performing the repair operation includes associating the first row address with the second row of memory cells and storing the first row address to a register of the memory device.

The data writing component 535 may be configured as or otherwise support a means for writing, based at least in part on receiving the command to initiate the repair operation, first data to the second row of memory cells based at least in part on a stored indication associated with replacing the first row with the second row. In some examples, the data writing component 535 may be configured as or otherwise support a means for writing, based at least in part on receiving the command to initiate the repair operation, third data to the first row of memory cells based at least in part on the stored indication associated with replacing the first row with the second row, where the third data is inverted relative to the first data.

In some examples, the data writing component 535 may be configured as or otherwise support a means for writing, based at least in part on receiving the second command to initiate the repair operation a second time, the first data to the fourth row of memory cells based at least in part on a stored indication associated with replacing the third row with the fourth row.

The data reading component 540 may be configured as or otherwise support a means for reading, based at least in part on receiving the command to initiate the repair operation, second data from the second row of memory cells. In some examples, the data reading component 540 may be configured as or otherwise support a means for reading, based at least in part on receiving the second command to initiate the repair operation the second time, third data from the fourth row of memory cells.

The error flag component 545 may be configured as or otherwise support a means for outputting, from the memory device, an error flag including a first value based at least in part on reading the second data from the second row of memory cells, where the first value of the error flag indicates that the repair operation was successfully performed based at least in part on the second data matching the first data. In some examples, the error flag component 545 may be configured as or otherwise support a means for outputting, from the memory device, the error flag including the first value based at least in part on determining that the value read from the one or more fuses of the fuse array matches the expected value for each respective fuse.

In some examples, the error flag component 545 may be configured as or otherwise support a means for outputting, from the memory device, the error flag including a second value based at least in part on reading the third data from the fourth row of memory cells, where the second value of the error flag indicates that the repair operation was unsuccessfully performed.

In some examples, the fuse reading component 550 may be configured as or otherwise support a means for reading, based at least in part on receiving the command to initiate the repair operation, a value of one or more fuses of a fuse array, where the fuse array is associated with repair operations performed on one or more rows of memory cells of the memory device.

In some examples, prior to performing the repair operation, the first row is associated with a first row address, and the determination component 555 may be configured as or otherwise support a means for determining that the first row of memory cells includes at least one faulty memory cell based at least in part on receiving the command.

In some examples, the second command component 560 may be configured as or otherwise support a means for receiving, at the memory device, a second command to initiate the repair operation a second time.

In some examples, the second repair component 565 may be configured as or otherwise support a means for performing the repair operation for the second time, where the repair operation includes replacing a third row of memory cells of the memory device with a fourth row of memory cells of the memory device.

In some examples, the fuse matching component 570 may be configured as or otherwise support a means for determining that the value read from the one or more fuses of the fuse array matches an expected value for each respective fuse.

In some examples, the error flag including a second value indicates an error associated with one or more circuits for performing the repair operation, that the repair operation was unsuccessfully performed, one or more fuses of the memory device storing respective values not matching expected values from performing the repair operation, or a combination thereof. In some examples, the first data written to the second row of memory cells of the memory device during the repair operation includes test data generated by the memory device.

Figure 6:
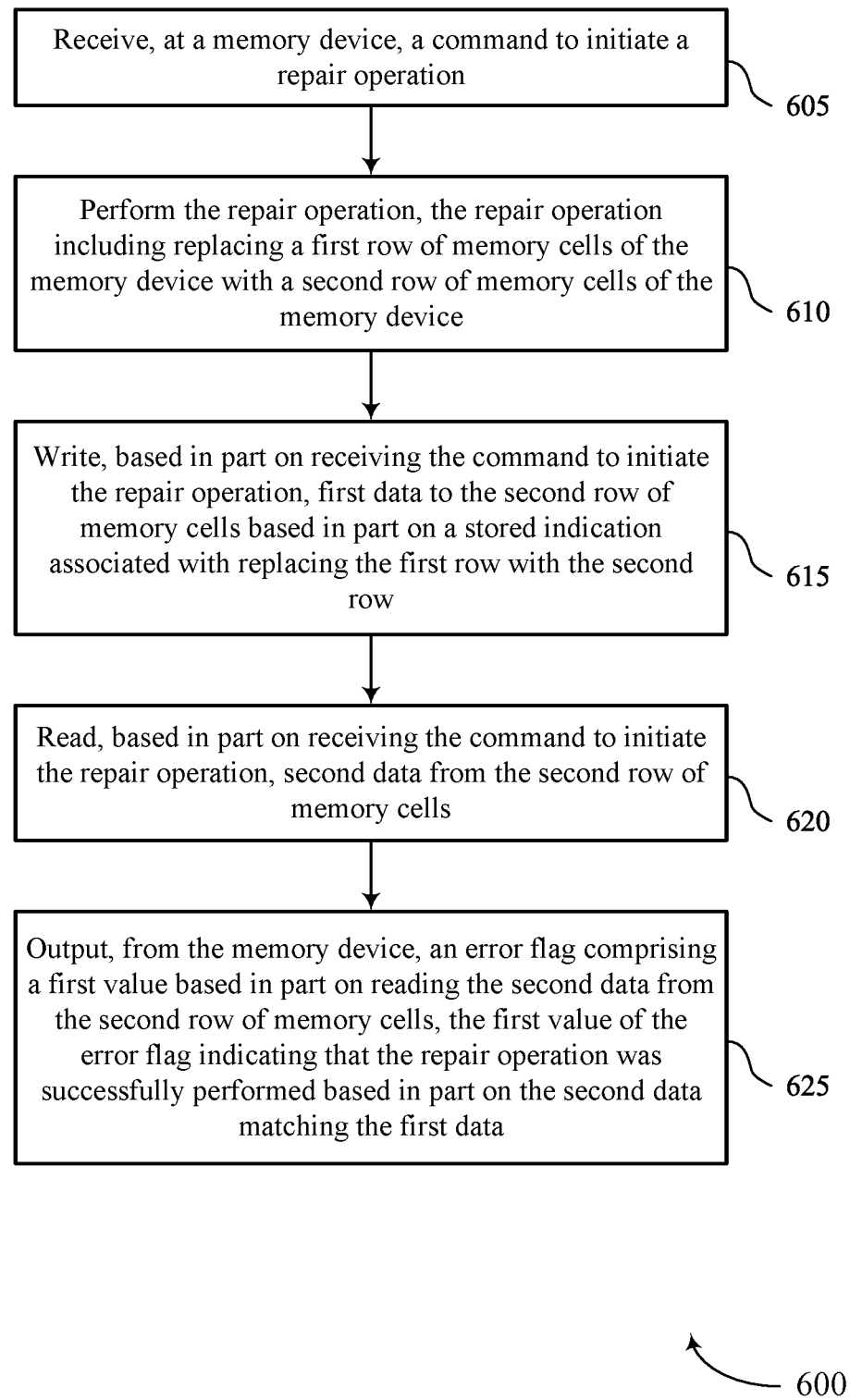
FIG. 6 shows a flowchart illustrating a method or methods that support self-repair verification in accordance with examples as disclosed herein.

FIG. 6 shows a flowchart illustrating a method 600 that supports self-repair verification in accordance with examples as disclosed herein. The operations of method 600 may be implemented by a Memory device or its components as described herein. For example, the operations of method 600 may be performed by a Memory device as described with reference to FIGS. 1 through 5. In some examples, a Memory device may execute a set of instructions to control the functional elements of the device to perform the described functions. Additionally, or alternatively, the Memory device may perform aspects of the described functions using special-purpose hardware.

At 605, the method may include receiving, at a memory device, a command to initiate a repair operation. The operations of 605 may be performed in accordance with examples as disclosed herein. In some examples, aspects of the operations of 605 may be performed by a command component 525 as described with reference to FIG. 5.

At 610, the method may include performing the repair operation, where the repair operation includes replacing a first row of memory cells of the memory device with a second row of memory cells of the memory device. The operations of 610 may be performed in accordance with examples as disclosed herein. In some examples, aspects of the operations of 610 may be performed by a repair component 530 as described with reference to FIG. 5.

At 615, the method may include writing, based at least in part on receiving the command to initiate the repair operation, first data to the second row of memory cells based at least in part on a stored indication associated with replacing the first row with the second row. The operations of 615 may be performed in accordance with examples as disclosed herein. In some examples, aspects of the operations of 615 may be performed by a data writing component 535 as described with reference to FIG. 5.

At 620, the method may include reading, based at least in part on receiving the command to initiate the repair operation, second data from the second row of memory cells. The operations of 620 may be performed in accordance with examples as disclosed herein. In some examples, aspects of the operations of 620 may be performed by a data reading component 540 as described with reference to FIG. 5.

At 625, the method may include outputting, from the memory device, an error flag including a first value based at least in part on reading the second data from the second row of memory cells, where the first value of the error flag indicates that the repair operation was successfully performed based at least in part on the second data matching the first data. The operations of 625 may be performed in accordance with examples as disclosed herein. In some examples, aspects of the operations of 625 may be performed by an error flag component 545 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory device, a command to initiate a repair operation; performing the repair operation, where the repair operation includes replacing a first row of memory cells of the memory device with a second row of memory cells of the memory device; writing, based at least in part on receiving the command to initiate the repair operation, first data to the second row of memory cells based at least in part on a stored indication associated with replacing the first row with the second row; reading, based at least in part on receiving the command to initiate the repair operation, second data from the second row of memory cells; and outputting, from the memory device, an error flag including a first value based at least in part on reading the second data from the second row of memory cells, where the first value of the error flag indicates that the repair operation was successfully performed based at least in part on the second data matching the first data.

Aspect 2: The method, apparatus, or non-transitory computer-readable medium of aspect 1, further including operations, features, circuitry, logic, means, or instructions, or any combination thereof for writing, based at least in part on receiving the command to initiate the repair operation, third data to the first row of memory cells based at least in part on the stored indication associated with replacing the first row with the second row, where the third data is inverted relative to the first data.

Aspect 3: The method, apparatus, or non-transitory computer-readable medium of any of aspects 1 through 2, further including operations, features, circuitry, logic, means, or instructions, or any combination thereof for reading, based at least in part on receiving the command to initiate the repair operation, a value of one or more fuses of a fuse array, where the fuse array is associated with repair operations performed on one or more rows of memory cells of the memory device.

Aspect 4: The method, apparatus, or non-transitory computer-readable medium of aspects 1 through 3, further including operations, features, circuitry, logic, means, or instructions, or any combination thereof for determining that the value read from the one or more fuses of the fuse array matches an expected value for each respective fuse and outputting, from the memory device, the error flag including the first value based at least in part on determining that the value read from the one or more fuses of the fuse array matches the expected value for each respective fuse.

Aspect 5: The method, apparatus, or non-transitory computer-readable medium of any of aspects 1 through 4. where the error flag including a second value indicates an error associated with one or more circuits for performing the repair operation, that the repair operation was unsuccessfully performed, one or more fuses of the memory device storing respective values not matching expected values from performing the repair operation, or a combination thereof Aspect 6: The method, apparatus, or non-transitory computer-readable medium of any of aspects 1 through 5 where, prior to performing the repair operation, the first row is associated with a first row address, and the method, apparatuses, and non-transitory computer-readable medium, further includes operations, features, circuitry, logic, means, or instructions, or any combination thereof for determining that the first row of memory cells includes at least one faulty memory cell based at least in part on receiving the command and performing the repair operation on the first row of memory cells, where performing the repair operation includes associating the first row address with the second row of memory cells and storing the first row address to a register of the memory device.

Aspect 7: The method, apparatus, or non-transitory computer-readable medium of any of aspects 1 through 6, further including operations, features, circuitry, logic, means, or instructions, or any combination thereof for receiving, at the memory device, a second command to initiate the repair operation a second time; performing the repair operation for the second time, where the repair operation includes replacing a third row of memory cells of the memory device with a fourth row of memory cells of the memory device; writing, based at least in part on receiving the second command to initiate the repair operation a second time, the first data to the fourth row of memory cells based at least in part on a stored indication associated with replacing the third row with the fourth row; reading, based at least in part on receiving the second command to initiate the repair operation the second time, third data from the fourth row of memory cells; and outputting, from the memory device, the error flag including a second value based at least in part on reading the third data from the fourth row of memory cells, where the second value of the error flag indicates that the repair operation was unsuccessfully performed.

Aspect 8: The method, apparatus, or non-transitory computer-readable medium of any of aspects 1 through 7. where the first data written to the second row of memory cells of the memory device during the repair operation includes test data generated by the memory device.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, at a memory device, a command to initiate a repair operation;
   performing the repair operation, wherein the repair operation comprises replacing a first row of memory cells of the memory device with a second row of memory cells of the memory device;
   writing, based at least in part on receiving the command to initiate the repair operation, first data to the second row of memory cells based at least in part on a stored indication associated with replacing the first row with the second row;
   reading, based at least in part on receiving the command to initiate the repair operation, second data from the second row of memory cells; and
   outputting, from the memory device, an error flag comprising a first value based at least in part on reading the second data from the second row of memory cells, wherein the first value of the error flag indicates that the repair operation was successfully performed based at least in part on the second data matching the first data.

2. The method of claim 1, further comprising:
   writing, based at least in part on receiving the command to initiate the repair operation, third data to the first row of memory cells based at least in part on the stored indication associated with replacing the first row with the second row, wherein the third data is inverted relative to the first data.

3. The method of claim 2, wherein:
   the first row is associated with a first row address; and
   performing the repair operation comprises writing an indication of the first row address to a set of fuses associated with the second row.

4. The method of claim 3, wherein writing the third data to the first row comprises addressing the first row and disabling the set of fuses associated with the second row.

5. The method of claim 1, further comprising:
   reading, based at least in part on receiving the command to initiate the repair operation, a value of one or more fuses of a fuse array, wherein the fuse array is associated with repair operations performed on one or more rows of memory cells of the memory device.

6. The method of claim 5, further comprising:
   determining that the value read from the one or more fuses of the fuse array matches an expected value for each respective fuse; and
   outputting, from the memory device, the error flag comprising the first value based at least in part on determining that the value read from the one or more fuses of the fuse array matches the expected value for each respective fuse.

7. The method of claim 1, wherein the error flag comprising a second value indicates an error associated with one or more circuits for performing the repair operation, that the repair operation was unsuccessfully performed, one or more fuses of the memory device storing respective values not matching expected values from performing the repair operation, or a combination thereof.

8. The method of claim 1, wherein, prior to performing the repair operation, the first row is associated with a first row address, the method further comprising:
   determining that the first row of memory cells comprises at least one faulty memory cell based at least in part on receiving the command; and
   performing the repair operation on the first row of memory cells, wherein performing the repair operation comprises associating the first row address with the second row of memory cells and storing the first row address to a register of the memory device.

9. The method of claim 8, wherein writing the first data to the second row of memory cells is based at least in part on identifying that the first row address is stored to the register of the memory device.

10. The method of claim 1, further comprising:
    receiving, at the memory device, a second command to initiate the repair operation a second time;
    performing the repair operation for the second time, wherein the repair operation comprises replacing a third row of memory cells of the memory device with a fourth row of memory cells of the memory device;
    writing, based at least in part on receiving the second command to initiate the repair operation the second time, the first data to the fourth row of memory cells based at least in part on a stored indication associated with replacing the third row with the fourth row;
    reading, based at least in part on receiving the second command to initiate the repair operation the second time, third data from the fourth row of memory cells; and
    outputting, from the memory device, the error flag comprising a second value based at least in part on reading the third data from the fourth row of memory cells, wherein the second value of the error flag indicates that the repair operation was unsuccessfully performed.

11. The method of claim 1, wherein the first data written to the second row of memory cells of the memory device during the repair operation comprises test data generated by the memory device.

12. A non-transitory computer-readable medium storing code, the code comprising instructions executable by a processor to:
    receive, at a memory device, a command to initiate a repair operation;
    perform the repair operation, wherein the repair operation comprises replacing a first row of memory cells of the memory device with a second row of memory cells of the memory device;
    write, based at least in part on receiving the command to initiate the repair operation, first data to the second row of memory cells based at least in part on a stored indication associated with replacing the first row with the second row;

read, based at least in part on receiving the command to initiate the repair operation, second data from the second row of memory cells; and output, from the memory device, an error flag comprising a first value based at least in part on reading the second data from the second row of memory cells, wherein the first value of the error flag indicates that the repair operation was successfully performed based at least in part on the second data matching the first data.

13. The non-transitory computer-readable medium of claim 12, wherein the instructions are further executable by the processor to:

write, based at least in part on receiving the command to initiate the repair operation, third data to the first row of memory cells based at least in part on the stored indication associated with replacing the first row with the second row, wherein the third data is inverted relative to the first data.

14. The non-transitory computer-readable medium of claim 13, wherein:

the first row is associated with a first row address, and performing the repair operation comprises writing an indication of the first row address to a set of fuses associated with the second row.

15. The non-transitory computer-readable medium of claim 14, wherein writing the third data to the first row comprises addressing the first row and disabling the set of fuses associated with the second row.

16. The non-transitory computer-readable medium of claim 12, wherein the instructions are further executable by the processor to:

read, based at least in part on receiving the command to initiate the repair operation, a value of one or more fuses of a fuse array, wherein the fuse array is associated with repair operations performed on one or more rows of memory cells of the memory device.

17. The non-transitory computer-readable medium of claim 16, wherein the instructions are further executable by the processor to:

determine that the value read from the one or more fuses of the fuse array matches an expected value for each respective fuse; and output, from the memory device, the error flag comprising the first value based at least in part on determining that the value read from the one or more fuses of the fuse array matches the expected value for each respective fuse.

18. The non-transitory computer-readable medium of claim 12, wherein the error flag comprising a second value indicates an error associated with one or more circuits for performing the repair operation, that the repair operation was unsuccessfully performed, one or more fuses of the memory device storing respective values not matching expected values from performing the repair operation, or a combination thereof.

19. The non-transitory computer-readable medium of claim 12, wherein the instructions are further executable by the processor, prior to performing the repair operation, to:

determine that the first row of memory cells comprises at least one faulty memory cell based at least in part on receiving the command; and perform the repair operation on the first row of memory cells, wherein performing the repair operation comprises associating a first row address of the first row of memory cells with the second row of memory cells and storing the first row address to a register of the memory device.

20. The non-transitory computer-readable medium of claim 19, wherein writing the first data to the second row of memory cells is based at least in part on identifying that the first row address is stored to the register of the memory device.

21. The non-transitory computer-readable medium of claim 12, wherein the instructions are further executable by the processor to:

receive, at the memory device, a second command to initiate the repair operation a second time;

perform the repair operation for the second time, wherein the repair operation comprises replacing a third row of memory cells of the memory device with a fourth row of memory cells of the memory device;

write, based at least in part on receiving the second command to initiate the repair operation the second time, the first data to the fourth row of memory cells based at least in part on a stored indication associated with replacing the third row with the fourth row;

read, based at least in part on receiving the second command to initiate the repair operation the second time, third data from the fourth row of memory cells; and output, from the memory device, the error flag comprising a second value based at least in part on reading the third data from the fourth row of memory cells, wherein the second value of the error flag indicates that the repair operation was unsuccessfully performed.

22. The non-transitory computer-readable medium of claim 12, wherein the first data written to the second row of memory cells of the memory device during the repair operation comprises test data generated by the memory device.

23. An apparatus, comprising:

a memory device comprising at least a first row of memory cells and a second row of memory cells; and a controller coupled with the memory device, wherein the controller is configured to cause the apparatus to:

receive, at the memory device, a command to initiate a repair operation;

perform the repair operation, wherein the repair operation comprises replacing the first row of memory cells of the memory device with the second row of memory cells of the memory device;

write, based at least in part on receiving the command to initiate the repair operation, first data to the second row of memory cells based at least in part on a stored indication associated with replacing the first row with the second row;

read, based at least in part on receiving the command to initiate the repair operation, second data from the second row of memory cells; and output, from the memory device, an error flag comprising a first value based at least in part on reading the second data from the second row of memory cells, wherein the first value of the error flag indicates that the repair operation was successfully performed based at least in part on the second data matching the first data.

24. The apparatus of claim 23, wherein the controller is further configured to cause the apparatus to:

write, based at least in part on receiving the command to initiate the repair operation, third data to the first row of memory cells based at least in part on the stored indication associated with replacing the first row with the second row, wherein the third data is inverted relative to the first data.

25. The apparatus of claim 24, wherein:

the first row is associated with a first row address, and
performing the repair operation comprises writing an indication of the first row address to a set of fuses associated with the second row.

* * * * *